(12) United States Patent
Long et al.

(10) Patent No.: US 10,845,437 B2
(45) Date of Patent: Nov. 24, 2020

(54) DOOR POSITION SENSING

(71) Applicant: Schlage Lock Company LLC, Carmel, IN (US)

(72) Inventors: Nicholas Long, Aurora, CO (US); Mark A. Ross, Federal Heights, CO (US)

(73) Assignee: Schlage Lock Company LLC, Carmel, IN (US)

( * ) Notice: Subject to any disclaimer, the term of this patent is extended or adjusted under 35 U.S.C. 154(b) by 70 days.

(21) Appl. No.: 16/280,529

(22) Filed: Feb. 20, 2019

(65) Prior Publication Data

US 2020/0264244 A1 Aug. 20, 2020

(51) Int. Cl.
*G01R 33/02* (2006.01)
*E06B 7/28* (2006.01)

(52) U.S. Cl.
CPC ............ *G01R 33/0206* (2013.01); *E06B 7/28* (2013.01)

(58) Field of Classification Search
CPC .. G01R 33/0206; G01D 5/2405; E05D 11/00; E06B 7/28; E05Y 2900/132
USPC ......................... 324/247, 663, 658, 649, 600
See application file for complete search history.

(56) References Cited

U.S. PATENT DOCUMENTS

| | | | |
|---|---|---|---|
| 9,790,736 B2 | 10/2017 | Kincaid et al. | |
| 9,982,459 B2 | 5/2018 | Telljohann et al. | |
| 2013/0293245 A1* | 11/2013 | Kuhnen | E05B 83/18 |
| | | | 324/658 |
| 2016/0061864 A1* | 3/2016 | White | G01R 15/16 |
| | | | 324/601 |
| 2016/0169708 A1* | 6/2016 | Sterk | B60R 25/2054 |
| | | | 324/658 |

\* cited by examiner

*Primary Examiner* — Giovanni Astacio-Oquendo
(74) *Attorney, Agent, or Firm* — Taft Stettinius & Hollister LLP (57) ABSTRACT

An exemplary method relates to determining an open/closed position of a door. The method generally involves generating, by a multi-axis magnetometer mounted to the door, a plurality of signals relating a magnetic field having a net magnetic flux point, and generating, by a controller and based on the plurality of signals, a current incidence angle defined between the multi-axis magnetometer and the net magnetic flux point. The method further includes comparing the current incidence angle to a known incidence angle, wherein the known incidence angle is defined between the multi-axis magnetometer and the net magnetic flux point when the door is in a known position. The method further includes determining the open/closed position of the door based on the comparison of the current incidence angle to the known incidence angle.

20 Claims, 6 Drawing Sheets

DOOR POSITION SENSING

TECHNICAL FIELD

The present disclosure generally relates to door position sensors, and more particularly but not exclusively relates to such door position sensors for locksets.

BACKGROUND

Certain existing locksets utilize a magnetometer that senses the magnetic field of a magnet installed to the strike, and determine the open/closed state of the door based on information received from the magnetometer. More particularly, some locksets of this type determine the door position based on the three-dimensional position of a center of magnetic flux detected by the magnetometer. However, it has been found that such approaches may suffer from certain drawbacks, such as those relating to false-positive readings (i.e., indicating that the door is secured when the latchbolt has not been fully extended). For these reasons among others, there remains a need for further improvements in this technological field.

SUMMARY

An exemplary method relates to determining an open/closed position of a door. The method generally involves generating, by a multi-axis magnetometer mounted to the door, a plurality of signals relating a magnetic field having a net magnetic flux point, and generating, by a controller and based on the plurality of signals, a current incidence angle defined between the multi-axis magnetometer and the net magnetic flux point. The method further includes comparing the current incidence angle to a known incidence angle, wherein the known incidence angle is defined between the multi-axis magnetometer and the net magnetic flux point when the door is in a known position. The method further includes determining the open/closed position of the door based on the comparison of the current incidence angle to the known incidence angle. Further embodiments, forms, features, and aspects of the present application shall become apparent from the description and figures provided herewith.

DETAILED DESCRIPTION OF ILLUSTRATIVE EMBODIMENTS

Although the concepts of the present disclosure are susceptible to various modifications and alternative forms, specific embodiments have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. It should further be appreciated that although reference to a "preferred" component or feature may indicate the desirability of a particular component or feature with respect to an embodiment, the disclosure is not so limiting with respect to other embodiments, which may omit such a component or feature. Further, when a particular feature, structure, or characteristic is described in connection with an embodiment, it is submitted that it is within the knowledge of one skilled in the art to implement such feature, structure, or characteristic in connection with other embodiments whether or not explicitly described.

Additionally, it should be appreciated that items included in a list in the form of "at least one of A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C). Items listed in the form of "A, B, and/or C" can also mean (A); (B); (C); (A and B); (B and C); (A and C); or (A, B, and C). Further, with respect to the claims, the use of words and phrases such as "a," "an," "at least one," and/or "at least one portion" should not be interpreted so as to be limiting to only one such element unless specifically stated to the contrary, and the use of phrases such as "at least a portion" and/or "a portion" should be interpreted as encompassing both embodiments including only a portion of such element and embodiments including the entirety of such element unless specifically stated to the contrary.

In the drawings, some structural or method features may be shown certain in specific arrangements and/or orderings. However, it should be appreciated that such specific arrangements and/or orderings may not necessarily be required. Rather, in some embodiments, such features may be arranged in a different manner and/or order than shown in the illustrative figures unless indicated to the contrary. Additionally, the inclusion of a structural or method feature in a particular figure is not meant to imply that such feature is required in all embodiments and, in some embodiments, may be omitted or may be combined with other features.

The disclosed embodiments may, in some cases, be implemented in hardware, firmware, software, or a combination thereof. The disclosed embodiments may also be implemented as instructions carried by or stored on one or more transitory or non-transitory machine-readable (e.g., computer-readable) storage media, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

Figure 1:
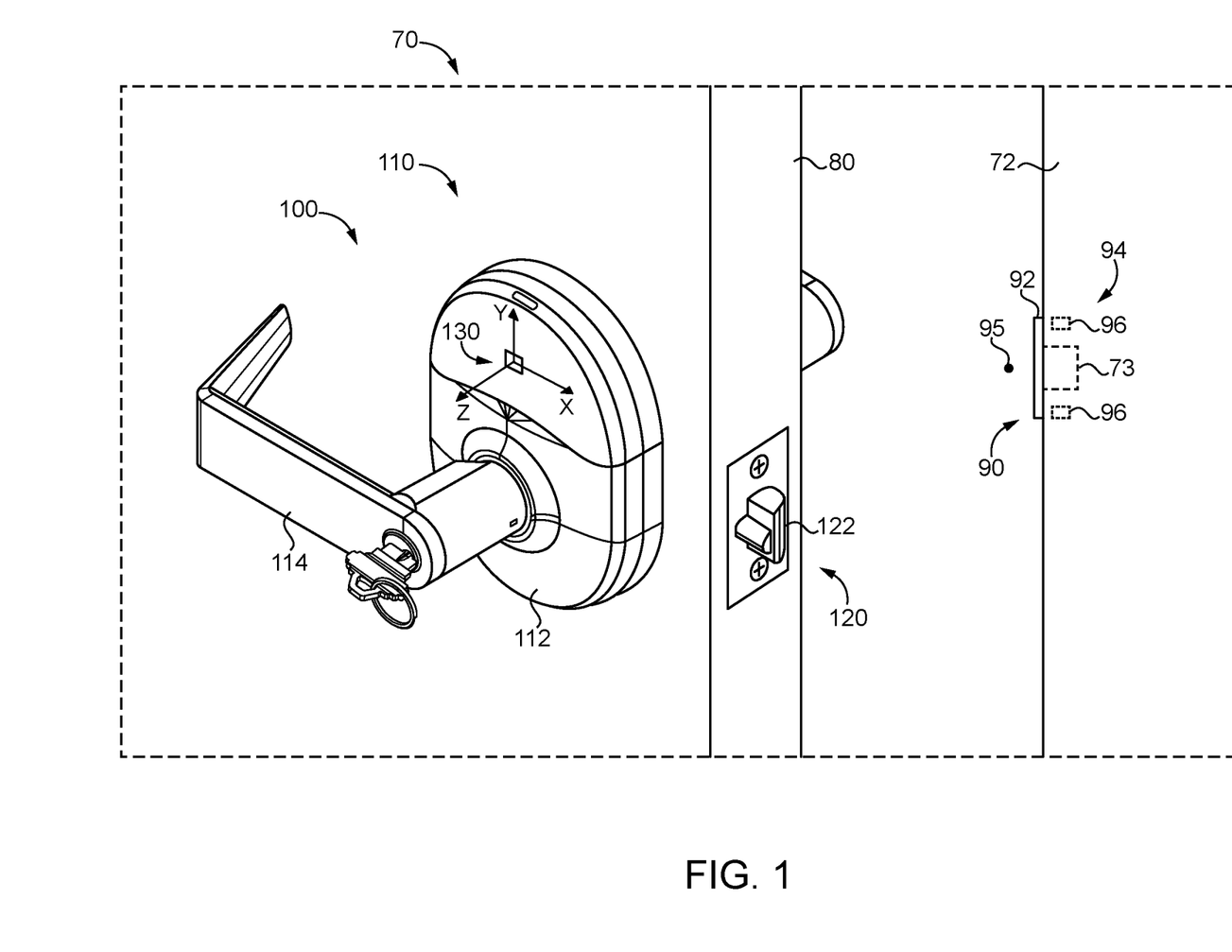
FIG. 1 illustrates a closure assembly including a door and a lockset according to certain embodiments.

With reference to FIG. 1, illustrated therein is a closure assembly 70 according to certain embodiments. The closure assembly 70 generally includes a doorframe 72, a door 80 movably mounted in the doorframe 72, a strike assembly 90 mounted to the doorframe 72, and an access control device mounted to the door 80. In the illustrated form, the access control device is provided in the form of a lockset 100 according to certain embodiments. In other embodiments, the access control device may take another form, such as that of an exit device.

The strike assembly 90 includes a strike plate 92 that is mounted to the doorframe 72 and is aligned with a pocket 73. The pocket 73 is operable to receive a latchbolt 122 of the lockset 100 when the door 80 is in a closed position. The strike assembly 90 further includes a magnetic field generator 94 operable to generate a magnetic field having a net magnetic flux point 95. While other forms are contemplated, in the illustrated embodiment, the magnetic field generator 94 includes a pair of permanent magnets 96 mounted above and below the pocket 73.

The lockset 100 generally includes a handleset 110 and a latch mechanism 120 operably connected with the handleset 110. The handleset 110 includes an escutcheon 112 and a handle 114 rotatably mounted to the escutcheon 112. The latch mechanism 120 includes a latchbolt 122 having an extended position and a retracted position, and is operably connected with the handleset 110 such that rotation of the handle 114 drives the latchbolt 122 from its extended position to its retracted position. The lockset 100 further comprises a multi-axis magnetometer 130. The magnetometer 130 is operable to sense magnetic fields along at least two axes, and in the illustrated form is operable to sense magnetic fields along three mutually-orthogonal axes X, Y, and Z.

Figure 2:
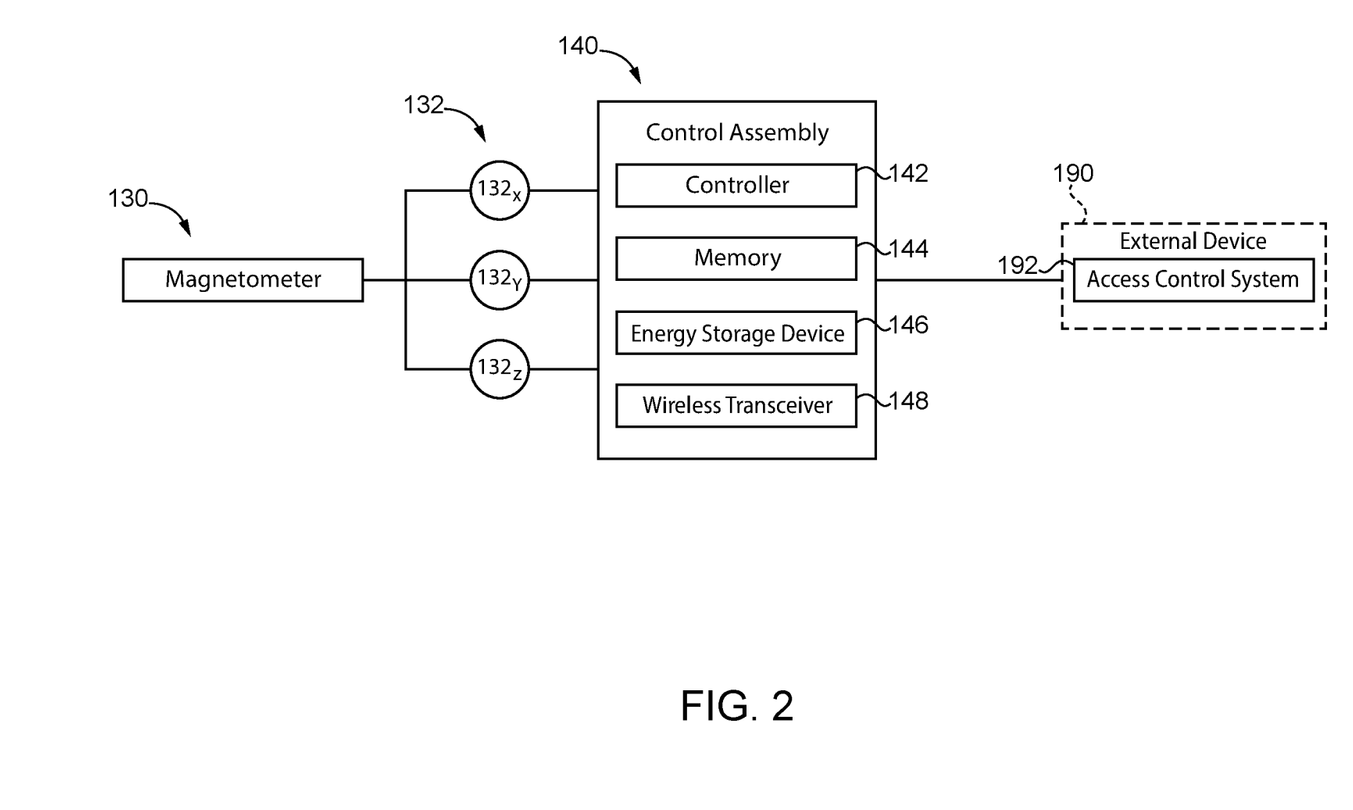
FIG. 2 is a schematic block diagram of the lockset.

With additional reference to FIG. 2, the lockset 100 further includes a control assembly 140 in communication with the magnetometer 130. The control assembly 140 includes a controller 142 and memory 144 having stored thereon instructions that, when executed by the controller 142, cause the controller 142 to perform the operations or tasks described herein. The control assembly 140 may further include an energy storage device 146 and/or a wireless transceiver 148 that facilitates communication between the controller 142 and an external device 190, such as an access control system 192. As described herein, the controller 142 is configured to determine a condition of the door 80 based on information 132 received from the magnetometer 130.

The magnetometer 130 is configured to generate information 132 corresponding to the strength of the sensed magnetic field, which corresponds to the relative position of the magnetometer 130 and the simulated net magnetic flux point 95. The magnetometer 130 is a multi-axis magnetometer that generates such information 132 for each of at least two axes. In the illustrated form, the magnetometer 130 is a three-axis magnetometer that generates the information 132 for each of the three axes X, Y, and Z in the form of an X signal 132x, a Y signal 132y, and a Z signal 132z. As described herein, in certain forms, the controller 142 may use only two of the three signals in determining the door condition, and the third signal may be ignored or disregarded. Thus, in certain forms, the magnetometer 130 may be provided as a two-axis magnetometer that generates the information for only two of the three axes X, Y, and Z. During operation, the value of each signal 132x, 132y, 132z varies based on the relative position of the magnetometer 130 and the net magnetic flux point 95. As such, the relative position of the magnetometer 130 and the net magnetic flux point 95 can be determined based on the signals 132x, 132y, 132z generated by the magnetometer 130.

Figure 3:
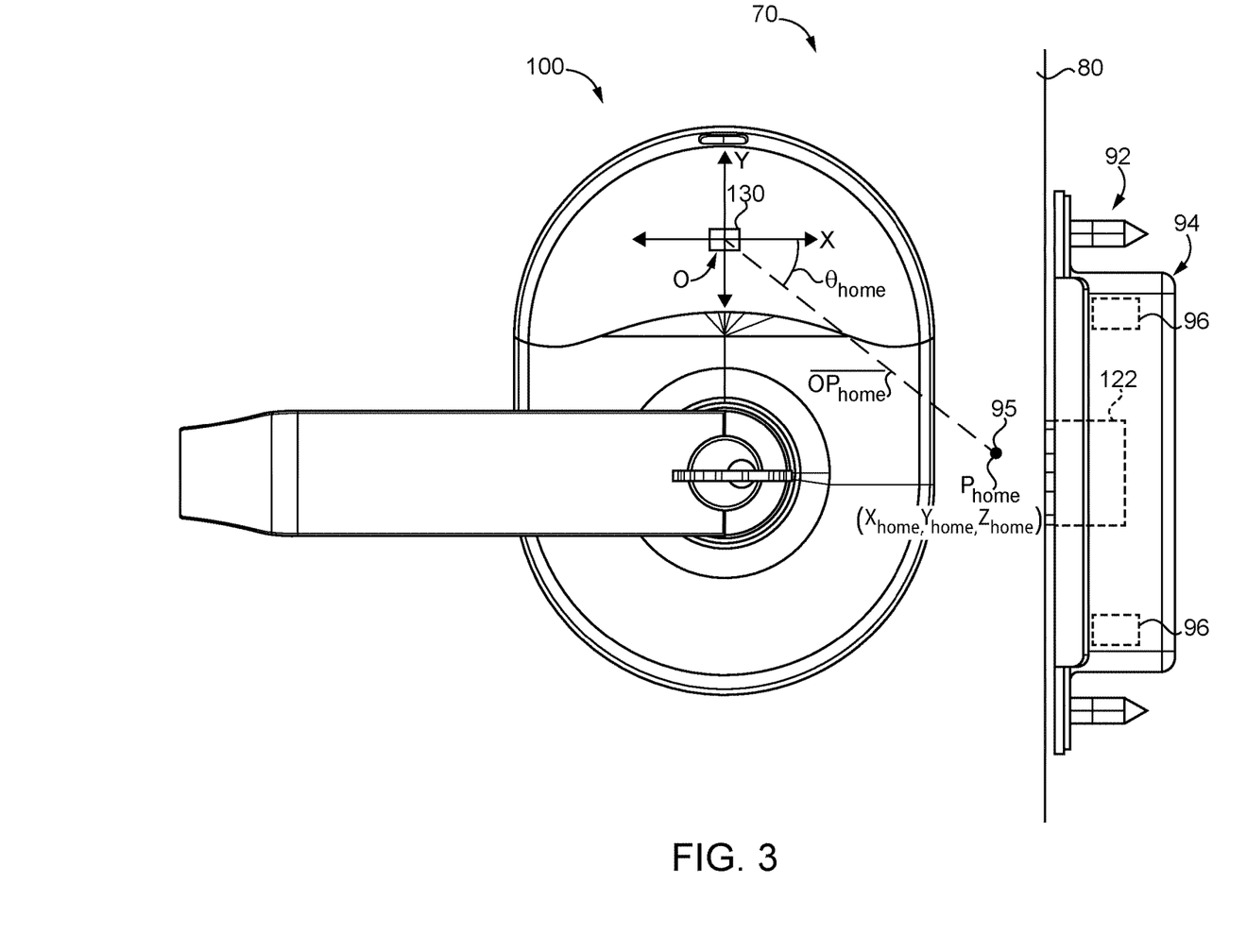
FIG. 3 illustrates the closure assembly in a secured state, in which the door is closed and a latchbolt of the lockset is extended and is resting in the strike pocket.

With additional reference to FIG. 3, illustrated therein is the closure assembly 70 in a secured condition, in which the door 80 is in its closed position and the latchbolt 122 is in its extended position and resting securely in the strike pocket 73. In this condition, a vector $\overline{OP_{home}}$ extends between an origin point O defined by the magnetometer 130 and a home position $P_{home}$, which is a theoretical point in space defined based on the signals 132x, 132y, 132z of the magnetometer 130. Generally speaking, the home position $P_{home}$ corresponds to the position of the net magnetic flux point 95 relative to the magnetometer 130. The home position $P_{home}$ includes positional components $X_{home}$, $Y_{home}$, $Z_{home}$, which respectively correspond to the signals $132_X$, $132_Y$, $132_Z$ generated by the magnetometer 130. Based on the home position $P_{home}$, a home position incidence angle $\theta_{home}$ can be generated. The home position incidence angle $\theta_{home}$ may be defined as the projection of the vector $\overline{OP_{home}}$ onto a selected plane. In the illustrated form, the home position incidence angle $\theta_{home}$ is defined along the X-Y plane. As such, the home position incidence angle $\theta_{home}$ can be calculated based on $X_{home}$ and $Y_{home}$ according to $$\theta_{home} = \tan^{-1}\left(\frac{Y_{home}}{X_{home}}\right). \qquad \text{Equation 1}$$

During a calibration procedure, the lockset 100 may determine the home position $P_{home}$ based on plural sets of information 132 generated when the closure assembly 70 is in the secured condition. For example, if ten sets of information 132 were used to calibrate the home position $P_{home}$, the home position component $X_{home}$ may be calculated according to $$X_{home} = \frac{1}{10}\sum_{i=1}^{10} X_i, \qquad \text{Equation 2}$$

where $X_i$ is determined based on the X signal $132_X$ for each of ten iterations. The remaining home position parameters $Y_{home}$ and $Z_{home}$ may be calculated in an analogous manner, and the home position incidence angle $\theta_{home}$ can be calculated based on the determined home position parameters $X_{home}$ and $Y_{home}$. As described herein, the home position incidence angle $\theta_{home}$ serves as a known incidence angle to which subsequently-calculated incidence angles are compared.

Following the calibration procedure, the lockset 100 may determine the condition of the closure assembly 70 based on information 132 received from the magnetometer 130. As described herein, the lockset 100 utilizes a current set of information 132 to determine a current incidence angle $\theta_{current}$, compares the current incidence angle $\theta_{current}$ to the home position incidence angle $\theta_{home}$, and determines the condition of the closure assembly 70 based at least in part upon the comparison of the current incidence angle $\theta_{current}$ with the home position incidence angle $\theta_{home}$.

Figure 4:
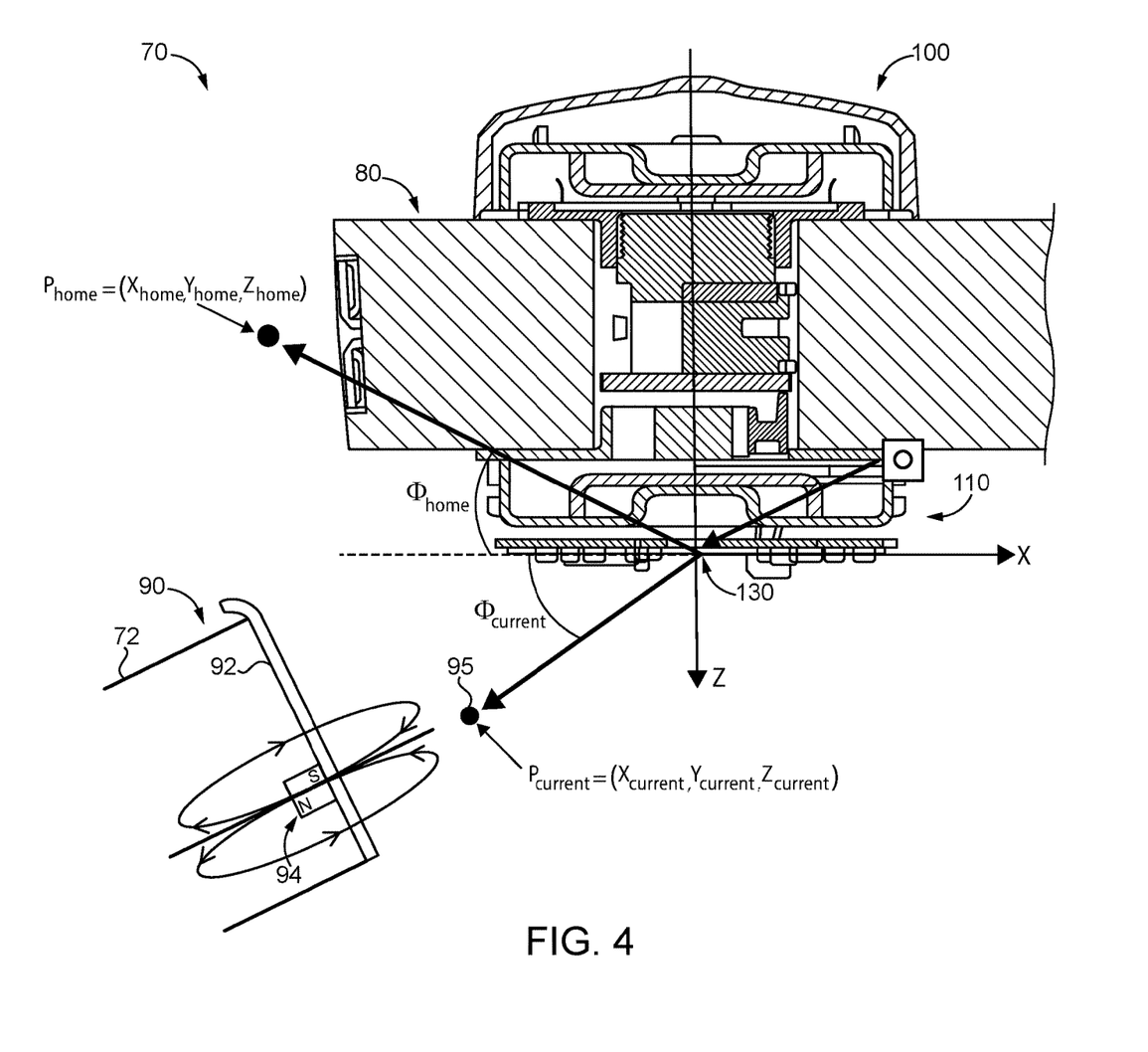
FIG. 4 illustrates the closure assembly in an unsecured state, in which the door is open and the latchbolt is retracted.

With additional reference to FIG. 4, illustrated therein is the closure assembly 70 with the door 80 in an open position. As a result of the open position of the door 80, the net magnetic flux point 95 has, relative to the magnetometer 130, a current position $P_{current}$ different from the home position $P_{home}$. The current position $P_{current}$ includes components $X_{current}$, $Y_{current}$, $Z_{current}$, and a vector $\overline{OP_{current}}$ extends between the origin point O and the current position $P_{current}$. As a result, the signals $132_X$, $132_Y$, $132_Z$ have values corresponding to the components $X_{current}$, $Y_{current}$, $Z_{current}$ of the current position $P_{current}$. In order to determine the current incidence angle $\theta_{current}$, the lockset 100 generates current position values $X_{current}$, $Y_{current}$, $Z_{current}$ based on the current values of the signals $132_X$, $132_Y$, $132_Z$. The current incidence angle $\theta_{current}$ is then calculated in a manner analogous to that described above with reference to the calculation of the home position incidence angle $\theta_{home}$. More particularly, the current incidence angle $\theta_{current}$ is calculated according to $$\theta_{current} = \tan^{-1}\left(\frac{Y_{current}}{X_{current}}\right). \qquad \text{Equation 3}$$

The home position incidence angle $\theta_{home}$ and the current incidence angle $\theta_{current}$ may be normalized to a selected region of the unit circle to compensate for different installations and orientations that may arise. The normalization may be provided according to Logic 1:

$$\text{if } \left(0 < \theta_{home} < \frac{\pi}{4}\right) \to \left\{\theta_{home} = \frac{\pi}{2} - \theta_{home}; \theta_{current} = \frac{\pi}{2} - \theta_{current}\right\}$$

$$\text{elseif } \left(0 > \theta_{home} > -\frac{\pi}{4}\right) \to$$

$$\left\{\theta_{home} = \frac{\pi}{2} + \theta_{home}; \theta_{current} = \frac{\pi}{2} + \theta_{current}\right\}$$

$$\text{elseif } \left(-\frac{\pi}{4} < \theta_{home} < -\frac{\pi}{2}\right) \to$$

$$\{\theta_{home} = abs(\theta_{home}); \theta_{current} = abs(\theta_{current})\}$$

Those skilled in the art will readily appreciate that Logic 1 normalizes the incidence angles $\theta$ to a value between $\pi/4$ radians (i.e., 45°) and $\pi/2$ radians (i.e. 90°). However, it should be understood that the other ranges may be utilized for the normalization, and that Logic 1 may be revised as desired to provide for normalization to another range. After optionally normalizing the incidence angles, the home position incidence angle $\theta_{home}$ and the current incidence angle $\theta_{current}$ may be compared to determine a condition of the closure assembly 70.

In certain embodiments, the home position incidence angle $\theta_{home}$ may be provided with an upper threshold and a lower threshold. For example, a lower threshold $\theta_{lower}$ may be calculated according to Equation 4: $\theta_{lower}=\theta_{home} \cdot (1-T_h)$, where $T_h$ is a threshold multiplier. Similarly, an upper threshold $\theta_{upper}$ may be calculated according to Equation 5: $\theta_{upper}=\theta_{home} \cdot (1+T_h)$, where $T_h$ is the threshold multiplier. The threshold multiplier $T_h$ is a function of the specific form of closure assembly 70 in which the lockset 100 is installed, and may vary based on several factors, including door width, door thickness, backset, and style of the access control device. The threshold multiplier $T_h$ may be determined experimentally for a particular type of installation, and subsequently used in other installations of the same type.

After normalizing the incidence angles $\theta_{home}$, $\theta_{current}$ and generating the thresholds $\theta_{lower}$, $\theta_{upper}$, the lockset 100 may determine the condition of the closure assembly 70 based on a comparison of the current incidence angle $\theta_{current}$ with the home position incidence angle $\theta_{home}$. For example, the lockset 100 may determine the current condition based on Logic 2:

if $(\theta_{lower} < \theta_{current} < \theta_{upper}) \to \{\text{Secured}\}$
else $\to \{\text{Unsecured}\}$ The secured state of the closure assembly 70 includes the closed position of the door 80, and may further include the extended position of the latchbolt 122 in the strike pocket 73. For example, the secured state may be a true door secured state in which the door 80 is closed and the latchbolt 122 is extended into the strike 92, thereby securing the door 80 in the closed position. In certain embodiments, the secured condition may be a mock door secured state in which the door 80 is in a nearly-closed position such that the strike 92 prevents full extension of the latchbolt 122. It has been found that the algorithm described hereinabove exhibits a sufficient sensitivity that it is possible to distinguish between the true door secured condition and the mock door secured condition. This is in contrast to certain prior approaches to using a magnetometer to determine door position, in which the algorithm lacks the sensitivity to distinguish between the true door secured condition and the mock door secured condition. As such, the current approach may be capable of determining the true door secured condition with a greater fidelity than such prior approaches.

In the embodiment described hereinabove, the incidence angles are calculated along the vertical X-Y plane that extends parallel to the vertical face of the door 80. It is also contemplated that the incidence angles may be calculated along another plane, in which case the incidence angles would be calculated based on the pair of position signals corresponding to the plane. For example, in embodiments in which the incidence angles are defined along the X-Z plane, each incidence angle would be calculated based on the signals 132x and 132z. However, contrary to expectations, it has been found that the best results may occur when the vertical plane parallel to the face of the door 80 is used as the reference plane.

In certain forms, the lockset 100 may calculate plural home position incidence angles and plural current position incidence angles. For example, a first home position incidence angle Nome may be calculated along the X-Y plane, and a second home position incidence angle $\phi_{home}$ may be calculated along the X-Z plane, as illustrated in FIG. 4. In such forms, the lockset 100 may similarly calculate a first current position incidence angle $\theta_{home}$ along the X-Y plane and a second current position incidence angle $\phi_{current}$ along the X-Z plane. Those skilled in the art will readily recognize that the second home position incidence angle home and the second current position incidence angle $\phi_{current}$ may be calculated based on the signals 132x and 132z in a manner analogous to that in which the first incidence angles $\theta_{home}$ and $\theta_{current}$ are calculated based on the signals 132x and 132y. The second incidence angles $\phi_{home}$ and $\phi_{current}$ may be normalized along the lines set forth in Logic 1, have thresholds generated along the lines set forth above in Equations 4 and 5, and be evaluated along the lines set forth in Logic 2. In certain forms, the lockset 100 may determine that the closure assembly 70 is in the secured condition when both the first and second current incidence angles $\theta_{current}$ and $\phi_{current}$ are within the range defined by the corresponding thresholds, and may determine that the closure assembly 70 is in the unsecured condition when either of the current incidence angles $\theta_{current}$ and $\phi_{current}$ fall outside the range defined by the corresponding thresholds.

Figure 5:
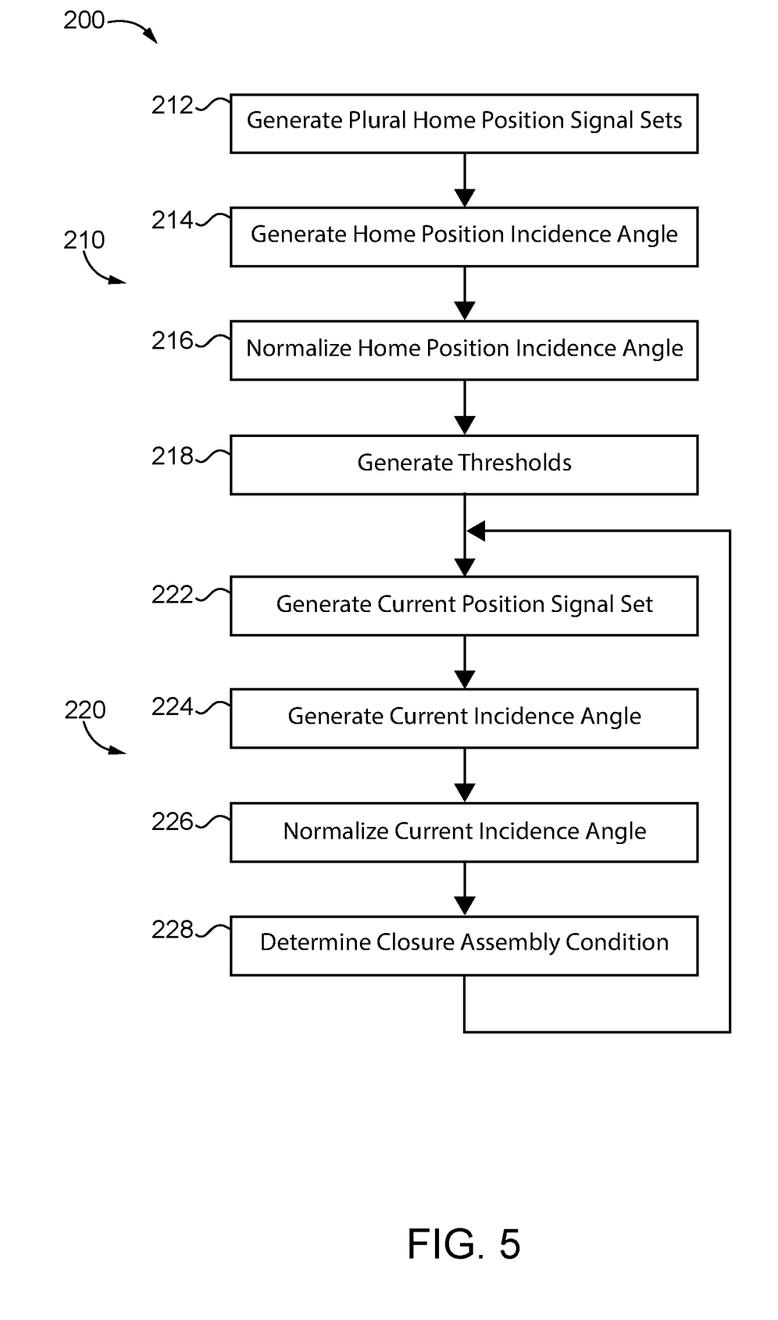
FIG. 5 is a schematic flow chart of a process according to certain embodiments.

With additional reference to FIG. 5, illustrated therein is an example process 200 that may, for example, be performed with or by the lockset 100. Blocks illustrated for the processes in the present application are understood to be examples only, and blocks may be combined or divided, and added or removed, as well as re-ordered in whole or in part, unless explicitly stated to the contrary. Unless specified to the contrary, it is contemplated that certain blocks performed in the process 200 may be performed wholly by the lockset 100 (e.g., by the magnetometer 130 and/or the control assembly 140) and/or the external device 190, or that the blocks may be distributed among one or more of the elements and/or additional devices or systems that are not specifically illustrated in FIGS. 1-4. Furthermore, while the blocks are illustrated in a generally serial fashion, it is to be appreciated that two or more of the blocks may be performed concurrently during performance of the process 200.

The process 200 generally includes a calibration procedure 210 and an operating procedure 220. As described herein, the calibration procedure 210 generally involves calibrating an access control device such as the lockset 100, and the operating procedure 220 generally involves operating the calibrated access control device (e.g., the lockset 100) to determine a current condition of the closure assembly 70. While the process 200 is described herein with specific reference to the lockset 100, it is to be appreciated that the process 200 may be performed using another form of access control device that includes a magnetometer, such as an exit device having a magnetometer.

The calibration procedure 210 may include block 212, which is performed while the closure assembly 70 is in a known condition. In the illustrated form, block 212 is performed while the closure assembly 70 is in the true door secured condition, in which the door 80 is fully closed and the latchbolt 122 is extended into the pocket 73. Block 212 generally involves generating a plurality of home position signal sets using the magnetometer 130. Block 212 may, for example, involve generating ten sets of information 132, each including signals 132x, 132y, 132z corresponding to a respective iteration component $X_i$, $Y_i$, $Z_i$. The iteration components $X_i$, $Y_i$, $Z_i$ may be averaged using Equation 1 above to determine the components $X_{home}$, $Y_{home}$, and $Z_{home}$, thereby defining the home position $P_{home}$ of the net magnetic flux point 95 relative to the magnetometer 130.

The calibration procedure 210 also includes block 214, which generally involves generating the home position incidence angle $\theta_{home}$ based on the home position $P_{home}$ calculated in block 212. In certain embodiments, block 214 involves generating the home position incidence angle $\theta_{home}$ based on the X and Y components $X_{home}$, $Y_{home}$ according to Equation 2 above, and the Z component $Z_{home}$ is disregarded. In such forms, block 212 may not necessarily involve generating the Z signal 132z for the home position signal sets, or may omit the calculation of the Z component $Z_{home}$. In other embodiments, block 214 may involve generating the second home position incidence angle $\phi_{home}$. In such forms, block 212 would involve generating the Z signal 132z and/or calculating the Z component $Z_{home}$.

The calibration procedure 210 may further include block 216, which generally involves normalizing the home position incidence angle $\theta_{home}$ to a selected segment of the unit circle. Block 216 may, for example, involve normalizing the home position incidence angle $\theta_{home}$ according to Logic 1 above. Block 216 may further involve normalizing the second home position incidence angle $\phi_{home}$ along analogous lines.

The calibration procedure 210 may further include block 218, which generally involves generating thresholds based on the home position incidence angle $\theta_{home}$. The thresholds may be based on the normalized home position incidence angle $\theta_{home}$, for example in embodiments in which the calibration procedure 210 includes block 216. Block 218 may, for example, involve generating a lower threshold $\theta_{lower}$ according to Equation 4 above and/or generating an upper threshold $\theta_{upper}$ according to Equation 5 above. Block 218 may further include generating second thresholds $\phi_{upper}$ and $\phi_{lower}$ based on the second home position incidence angle $\phi_{home}$.

The operating procedure 220 may begin with block 222, which generally involves generating a current position signal set using the magnetometer 130. Block 222 may, for example, involve generating signals 132x, 132y, 132z and determining the components $X_{current}$, $Y_{current}$, $Z_{current}$ based on the signals 132x, 132y, 132z, thereby defining the current position $P_{current}$ of the net magnetic flux point 95 relative to the magnetometer 130.

The operating procedure 220 also includes block 224, which generally involves generating the current incidence angle $\theta_{current}$ based on the sensed current position $P_{current}$. In certain embodiments, block 224 involves generating the current position incidence angle $\theta_{current}$ based on the X and Y components $X_{current}$, $Y_{current}$ according to Equation 3 above, and the Z component $Z_{current}$ is disregarded. In such forms, block 222 may not necessarily involve generating the Z signal 132z for the current position signal set, or may omit the calculation of the Z component $Z_{current}$. In other embodiments, block 224 may involve generating the second current position incidence angle $\phi_{current}$. In such forms, block 222 may involve generating the Z component $Z_{current}$ based on the signal 132z.

The operating procedure 220 may further include block 226, which generally involves normalizing the current incidence angle $\theta_{current}$ to the selected segment of the unit circle. Block 226 may involve normalizing the current incidence angle $\theta_{current}$ based on the normalization of the home position incidence angle $\theta_{home}$ according to Logic 1 above. Block 226 may further involve normalizing the second current incidence angle $\phi_{current}$ along analogous lines.

The operating procedure 220 further includes block 228, which generally involves determining the current condition of the closure assembly 70 based on a comparison of the current incidence angle $\theta_{current}$ and the home position incidence angle $\theta_{home}$. For example, block 228 may involve determining the current condition of the closure assembly 70 by comparing the current incidence angle $\theta_{current}$ with the upper and lower thresholds $\theta_{upper}$, $\theta_{lower}$ according to Logic 2 above, thereby determining the secured/unsecured condition of the closure assembly 70. In certain forms, the determination of block 228 may additionally or alternatively be based on the second current incidence angle $\phi_{current}$. For example, block 228 may involve determining the secured condition of the closure assembly 70 when both current incidence angles $\theta_{current}$ and $\phi_{current}$ are within the range defined by the corresponding thresholds, and may determine that the closure assembly 70 is in the unsecured condition when either of the current incidence angles $\theta_{current}$ and $\phi_{current}$ fall outside the range defined by the corresponding thresholds.

With the operating procedure 220 complete, the lockset 100 has determined the secured/unsecured condition of the closure assembly 70. Information related to the determined condition may be stored in an audit trail (e.g., in memory 144) and/or transmitted to the external device 190 (e.g., via the wireless transceiver 148). The operating procedure 220 may be reiterated periodically, for example every three seconds, to aid in the generation of an audit trail. Additionally or alternatively, the operating procedure 220 may be reiterated in the event of an initializing condition, such as the detection of a credential being presented to the lockset 100 and/or a request from the external device 190.

Figure 6:
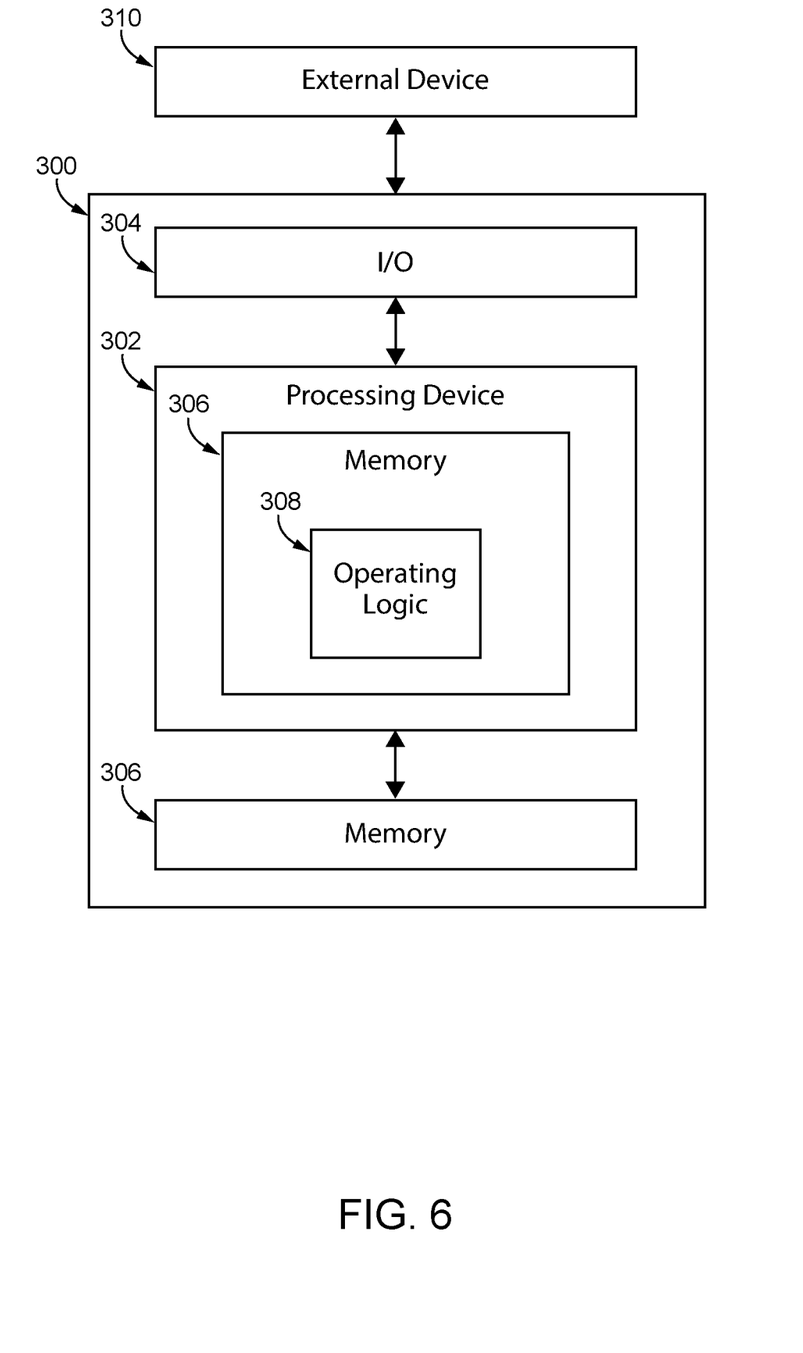
FIG. 6 is a schematic block diagram of a computing device.

Referring now to FIG. 6, a simplified block diagram of at least one embodiment of a computing device 300 is shown.

The illustrative computing device 300 depicts at least one embodiment of a lockset, control assembly, or controller that may be utilized in connection with the lockset 100, the control assembly 140, and/or the controller 142 illustrated in FIGS. 1-4.

Depending on the particular embodiment, the computing device 300 may be embodied as a server, desktop computer, laptop computer, tablet computer, notebook, netbook, Ultrabook™ mobile computing device, cellular phone, smartphone, wearable computing device, personal digital assistant, Internet of Things (IoT) device, reader device, access control device, control panel, processing system, router, gateway, and/or any other computing, processing, and/or communication device capable of performing the functions described herein.

The computing device 300 includes a processing device 302 that executes algorithms and/or processes data in accordance with operating logic 308, an input/output device 304 that enables communication between the computing device 300 and one or more external devices 310, and memory 306 which stores, for example, data received from the external device 310 via the input/output device 304.

The input/output device 304 allows the computing device 300 to communicate with the external device 310. For example, the input/output device 304 may include a transceiver, a network adapter, a network card, an interface, one or more communication ports (e.g., a USB port, serial port, parallel port, an analog port, a digital port, VGA, DVI, HDMI, FireWire, CAT 5, or any other type of communication port or interface), and/or other communication circuitry. Communication circuitry may be configured to use any one or more communication technologies (e.g., wireless or wired communications) and associated protocols (e.g., Ethernet, Bluetooth®, Bluetooth Low Energy (BLE), WiMAX, etc.) to effect such communication depending on the particular computing device 300. The input/output device 304 may include hardware, software, and/or firmware suitable for performing the techniques described herein.

The external device 310 may be any type of device that allows data to be inputted or outputted from the computing device 300. For example, in various embodiments, the external device 310 may be embodied as the lockset 100, the magnetometer 130, the control assembly 140, and/or the external device 190. Further, in some embodiments, the external device 310 may be embodied as another computing device, switch, diagnostic tool, controller, printer, display, alarm, peripheral device (e.g., keyboard, mouse, touch screen display, etc.), and/or any other computing, processing, and/or communication device capable of performing the functions described herein. Furthermore, in some embodiments, it should be appreciated that the external device 310 may be integrated into the computing device 300.

The processing device 302 may be embodied as any type of processor(s) capable of performing the functions described herein. In particular, the processing device 302 may be embodied as one or more single or multi-core processors, microcontrollers, or other processor or processing/controlling circuits. For example, in some embodiments, the processing device 302 may include or be embodied as an arithmetic logic unit (ALU), central processing unit (CPU), digital signal processor (DSP), and/or another suitable processor(s). The processing device 302 may be a programmable type, a dedicated hardwired state machine, or a combination thereof. Processing devices 302 with multiple processing units may utilize distributed, pipelined, and/or parallel processing in various embodiments. Further, the processing device 302 may be dedicated to performance of just the operations described herein, or may be utilized in one or more additional applications. In the illustrative embodiment, the processing device 302 is of a programmable variety that executes algorithms and/or processes data in accordance with operating logic 308 as defined by programming instructions (such as software or firmware) stored in memory 306. Additionally or alternatively, the operating logic 308 for processing device 302 may be at least partially defined by hardwired logic or other hardware. Further, the processing device 302 may include one or more components of any type suitable to process the signals received from input/output device 304 or from other components or devices and to provide desired output signals. Such components may include digital circuitry, analog circuitry, or a combination thereof.

The memory 306 may be of one or more types of non-transitory computer-readable media, such as a solid-state memory, electromagnetic memory, optical memory, or a combination thereof. Furthermore, the memory 306 may be volatile and/or nonvolatile and, in some embodiments, some or all of the memory 306 may be of a portable variety, such as a disk, tape, memory stick, cartridge, and/or other suitable portable memory. In operation, the memory 306 may store various data and software used during operation of the computing device 300 such as operating systems, applications, programs, libraries, and drivers. It should be appreciated that the memory 306 may store data that is manipulated by the operating logic 308 of processing device 302, such as, for example, data representative of signals received from and/or sent to the input/output device 304 in addition to or in lieu of storing programming instructions defining operating logic 308. As illustrated, the memory 306 may be included with the processing device 302 and/or coupled to the processing device 302 depending on the particular embodiment. For example, in some embodiments, the processing device 302, the memory 306, and/or other components of the computing device 300 may form a portion of a system-on-a-chip (SoC) and be incorporated on a single integrated circuit chip.

In some embodiments, various components of the computing device 300 (e.g., the processing device 302 and the memory 306) may be communicatively coupled via an input/output subsystem, which may be embodied as circuitry and/or components to facilitate input/output operations with the processing device 302, the memory 306, and other components of the computing device 300. For example, the input/output subsystem may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations.

The computing device 300 may include other or additional components, such as those commonly found in a typical computing device (e.g., various input/output devices and/or other components), in other embodiments. It should be further appreciated that one or more of the components of the computing device 300 described herein may be distributed across multiple computing devices. In other words, the techniques described herein may be employed by a computing system that includes one or more computing devices. Additionally, although only a single processing device 302, I/O device 304, and memory 306 are illustratively shown in FIG. 6, it should be appreciated that a particular computing device 300 may include multiple processing devices 302, I/O devices 304, and/or memories 306 in other embodiments. Further, in some embodiments, more than one external device 310 may be in communication with the computing device 300.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected.

It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A method of determining an open/closed position of a door, the method comprising:
    generating, by a multi-axis magnetometer mounted to the door, a plurality of signals relating to a magnetic field having a net magnetic flux point;
    generating, by a controller and based on the plurality of signals, a current incidence angle defined between the multi-axis magnetometer and the net magnetic flux point;
    comparing the current incidence angle to a known incidence angle, wherein the known incidence angle is defined between the multi-axis magnetometer and the net magnetic flux point when the door is in a known position; and
    determining the open/closed position of the door based on the comparing of the current incidence angle to the known incidence angle.

2. The method of claim 1, wherein the plurality of signals comprises a first signal indicative of a strength of the magnetic field along a first axis, and a second signal indicative of a strength of the magnetic field along a second axis; and
    wherein the generating of the current incidence angle comprises generating the current incidence angle based on the first signal and the second signal.

3. The method of claim 2, wherein the first axis and the second axis are coplanar along a reference plane, and wherein the current incidence angle is defined along the reference plane.

4. The method of claim 3, wherein the reference plane is a vertical reference plane arranged parallel to a face of the door.

5. The method of claim 2, wherein the plurality of signals further comprises a third signal indicative of the strength of the magnetic field along a third axis orthogonal to the first axis and to the second axis, and wherein the generating of the current incidence angle comprises disregarding the third signal.

6. The method of claim 1, further comprising generating the known incidence angle, wherein generating the known incidence angle comprises:
    with the door in the known position, generating a plurality of signal sets, wherein each signal set is generated with the door in the known position and comprises a corresponding first signal and a corresponding second signal, wherein the first signal is indicative of a strength of the magnetic field along a first axis, and wherein the second signal is indicative of a strength of the magnetic field along a second axis;
    generating, based on a plurality of first signals, a first parameter relating to an average strength of the magnetic field along the first axis with the door in the known position;
    generating, based on a plurality of second signals, a second parameter relating to an average strength of the magnetic field along the second axis with the door in the known position; and
    generating the known incidence angle based on the first parameter and the second parameter.

7. The method of claim 1, wherein the known incidence angle has an upper threshold and a lower threshold, and wherein the determining of the open/closed position of the door based on the comparison of the current incidence angle to the known incidence angle comprises determining that the door is in the known position when the current incidence angle is between the lower threshold and the upper threshold.

8. The method of claim 1, further comprising, prior to the comparing of the current incidence angle to the known incidence angle, normalizing the current incidence angle to a selected region of a unit circle, and wherein the known incidence angle is normalized to the selected region of the unit circle.

9. A method of operating an access control device mounted to a door of a closure assembly comprising the door, a doorframe, and a magnetic field generator mounted to the doorframe, and wherein the magnetic field generator generates a magnetic field having a net magnetic flux point, wherein the method comprises:
    generating, by a multi-axis magnetometer of the access control device, a plurality of signals, wherein each signal is indicative of a relative position of the multi-axis magnetometer and the net magnetic flux point along a corresponding and respective axis;
    generating, by a controller of the access control device and based on the plurality of signals, a first current incidence angle defined between the multi-axis magnetometer and the net magnetic flux point; and
    determining, by the controller and based on the first current incidence angle, a condition of the closure assembly.

10. The method of claim 9, wherein the determining of the condition of the closure assembly based on the current incidence angle comprises determining an open/closed position of the door based on the first current incidence angle.

11. The method of claim 9, wherein the plurality of signals includes a first signal indicative of a relative position of the multi-axis magnetometer and the net magnetic flux point along a first axis of the multi-axis magnetometer, and a second signal indicative of a relative position of the multi-axis magnetometer and the net magnetic flux point along a second axis of the multi-axis magnetometer;
    wherein the first axis and the second axis are arranged coplanar along a first reference plane; and
    wherein the first current incidence angle is defined along the first reference plane.

12. The method of claim 11, wherein the plurality of signals further includes a third signal indicative of a relative position of the multi-axis magnetometer and the net magnetic flux point along a third axis of the multi-axis magnetometer;
    wherein the method further comprises generating, by the controller of the access control device and based on the first signal and the third signal, a second current incidence angle defined between the multi-axis magnetometer and the net magnetic flux point; and
    wherein the determining of the condition of the closure assembly is further based on the second current incidence angle.

13. The method of claim 11, wherein the plurality of signals further includes a third signal indicative of a relative position of the multi-axis magnetometer and the net magnetic flux point along a third axis orthogonal to the first reference plane; and
    wherein the first current incidence angle is generated based on the first signal and the second signal and not based on the third signal.

14. The method of claim 9, wherein the determining involves comparing the first current incidence angle to a known incidence angle, the known incidence angle corresponding to a known condition of the closure assembly.

15. The method of claim 9, wherein the magnetic field generator comprises a plurality of magnets mounted to a strike plate, and wherein the strike plate is mounted to the doorframe.

16. An access control device configured for mounting to a door of a closure assembly, the access control device comprising:
    a multi-axis magnetometer configured to generate a first signal indicative of a position of a net magnetic flux point along a first axis and a second signal indicative of a position of the net magnetic flux point along a second axis, wherein the first axis and the second axis are arranged coplanar to one another along a reference plane;
    a controller in communication with the multi-axis magnetometer; and
    memory in communication with the controller, the memory comprising instructions that, when executed by the controller, cause the controller to:
        generate a current incidence angle based on the first signal and the second signal;
        compare the current incidence angle to a known incidence angle, the known incidence angle corresponding to a known condition of the closure assembly; and
        determine a current condition of the closure assembly based on the comparison of the current incidence angle and the known incidence angle.

17. The access control device of claim 16, further comprising a bolt having an extended/retracted position;
    wherein the position of the net magnetic flux point along at least one of the first axis or the second axis depends upon the extended/retracted position of the bolt; and
    wherein the current condition of the closure assembly comprises the extended/retracted position of the bolt.

18. The access control device of claim 17, wherein the known condition of the closure assembly is a secured condition of the closure assembly, and wherein the secured condition of the closure assembly comprises a closed position of the door and an extended position of the bolt in which the bolt is seated in a strike pocket.

19. The access control device of claim 16, wherein the known incidence angle has an upper threshold and a lower threshold, and wherein to determine the current condition of the door based on the comparison of the current incidence angle and the known incidence angle comprises to determine that the current condition of the closure assembly is the known condition of the closure assembly when the current incidence angle is between the upper threshold and the lower threshold.

20. The access control device of claim 16, wherein the known condition of the closure assembly comprises a closed position of the door.

* * * * *